(12) United States Patent
Yen

(10) Patent No.: US 11,888,056 B2
(45) Date of Patent: Jan. 30, 2024

(54) SILICON CARBIDE MOS-GATED SEMICONDUCTOR DEVICE

(71) Applicant: Fast SiC Semiconductor Incorporated, Hsinchu (TW)

(72) Inventor: Cheng-Tyng Yen, Hsinchu (TW)

(73) Assignee: FAST SIC SEMICONDUCTOR INCORPORATED, Hsinchu (TW)

( * ) Notice: Subject to any disclaimer, the term of this patent is extended or adjusted under 35 U.S.C. 154(b) by 337 days.

(21) Appl. No.: 17/468,582

(22) Filed: Sep. 7, 2021

(65) Prior Publication Data

US 2023/0071655 A1 Mar. 9, 2023

(51) Int. Cl.
*H01L 29/78* (2006.01)
*H01L 29/423* (2006.01)
*H01L 29/06* (2006.01)
*H01L 29/16* (2006.01)

(52) U.S. Cl.
CPC ...... *H01L 29/7803* (2013.01); *H01L 29/0696* (2013.01); *H01L 29/4238* (2013.01); *H01L 29/1608* (2013.01)

(58) Field of Classification Search
None
See application file for complete search history.

(56) References Cited

U.S. PATENT DOCUMENTS

| | | | |
|---|---|---|---|
| 2011/0001144 A1* | 1/2011 | Fujikawa | H01L 29/8083 257/77 |
| 2019/0081136 A1* | 3/2019 | Yen | H01L 29/1095 |
| 2019/0229211 A1* | 7/2019 | Bu | H01L 29/66068 |

* cited by examiner

*Primary Examiner* — William C Trapanese
(74) *Attorney, Agent, or Firm* — Muncy, Geissler, Olds & Lowe, P.C.

(57) ABSTRACT

A silicon carbide MOS-gated semiconductor device comprises a silicon carbide substrate, a drift layer, a first doped region, a second doped region, a plurality of third doped regions, a gate insulating layer, a gate electrode, an interlayer dielectric layer, and a metal layer. The gate electrode comprises a gate bus region and an active region. The active region comprises a plurality of gate electrode openings. The two adjacent gate electrode openings have a minimum width ($W_g$) which is satisfied the following formula:

$$W_g > W_{jfet} + 2 \times L_{ch} + 2 \times L_x$$

$L_{ch}$ represents a channel length of channel regions, $W_{jfet}$ represents a minimum width of JFET regions, and $L_x$ represents a minimum overlapping length between the gate electrode and the second doped region.

11 Claims, 14 Drawing Sheets

SILICON CARBIDE MOS-GATED SEMICONDUCTOR DEVICE

FIELD OF THE INVENTION

The present disclosure relates to a silicon carbide semiconductor device and more particularly to a silicon carbide MOS-gated semiconductor device.

BACKGROUND OF THE INVENTION

Silicon carbide (SiC) as an emerging semiconductor material for power devices provides superior properties including high dielectric strength to the electric field and low intrinsic carrier concentration over conventional silicon (Si) power devices due to its wide band gap.

The high dielectric strength of SiC enables a theoretical drift layer unipolar specific on-resistance much lower beyond the limit of Si and the low intrinsic carrier concentration enables stable operation of SiC power devices at high temperatures.

To meet the requirements of EMI regulations for power supplies, an external gate resistor with relatively high external gate resistance (Rg,ext) is usually connected to the gate of Si-based Super-Junction MOSFET (SJ-MOSFET) to suppress the oscillations of gate voltage (Vg) and drain-to-source voltage (Vds) induced by the high dV/dt during the switching transients. As a wide bandgap semiconductor, SiC MOSFET can provide a similar on-resistance with a much smaller chip size. For example, the chip size of 650V SiC MOSFET can be reduced to ¼~1/20 of the chip size of Si SJ-MOSFET with the same on-resistance. The internal gate resistance (Rg,int) is the gate equivalent series resistance (ESR) of MOSFET, which is usually inversely proportional to the chip size of MOSFET, i.e., the Rg,int is higher when the chip size is smaller. Therefore, the Rg,int of SiC MOSFET is usually higher than that of Si SJ-MOSFET with similar on-resistance. Because the peak dV/dt of SiC MOSFET during switching transients is much lower than that of the Si SJ-MOSFET with the same switching loss, which enables the use of small or zero resistance external gate resistor without worrying about the EMI performance. Since switching loss of MOSFET Psw follows the formula below:

$$P_{sw} \propto (Rg,ext + Rg,int)$$

A higher Rg,int may, to some extent, limit the best performance of SiC MOSFET can be achieved.

In the mean time, for some applications, where the switching frequency is relatively low and it is necessary to parallelly connect several MOSFETs to achieve higher power level, a higher Rg,int may be required to minimize the unbalanced switching among MOSFETs. Therefore, there is a need to reduce or adjust Rg,int according to applications with a simple, cost-effective way.

SUMMARY OF THE INVENTION

Embodiments of the present invention provide.

DETAILED DESCRIPTION OF THE PREFERRED EMBODIMENTS

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for simplicity and clarity and does not in itself dictate a relationship between the various embodiments and/or configurations discussed.

Furthermore, spatially relative terms, such as "over," "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented, and the spatially relative descriptors used herein may likewise be interpreted accordingly.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that, although the terms first, second, etc. are, in some instances, used herein to describe various elements, these elements should not be limited by these terms. These terms are only used to distinguish one element from another.

Although some embodiments are discussed with steps performed in a particular order, these steps may be performed in another logical order. Some of the features described below can be replaced or eliminated for different embodiments. It is understandable that additional operations may be performed before, during, or after the method described, and that in other embodiments of the method, some of the operations may be substituted or omitted.

Figure 1A:
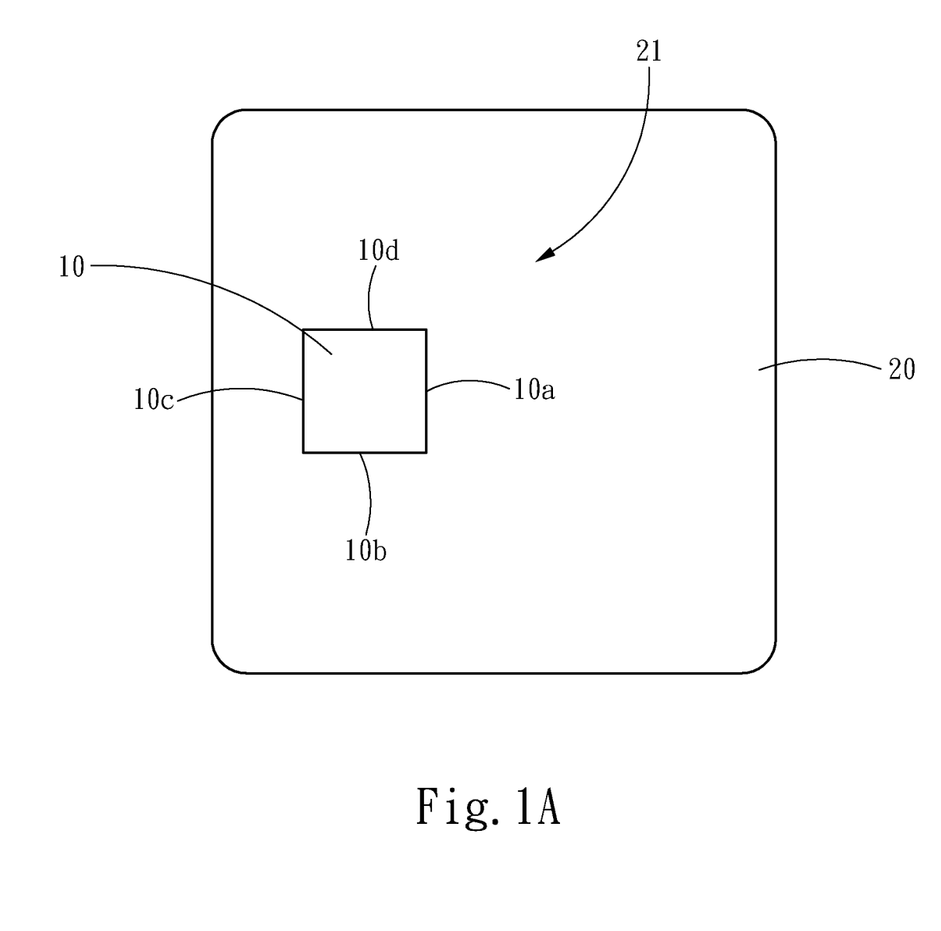
FIG. 1A is a schematic top view of a MOS-gated semiconductor device according to one embodiment of the present disclosure.
Figure 1B:
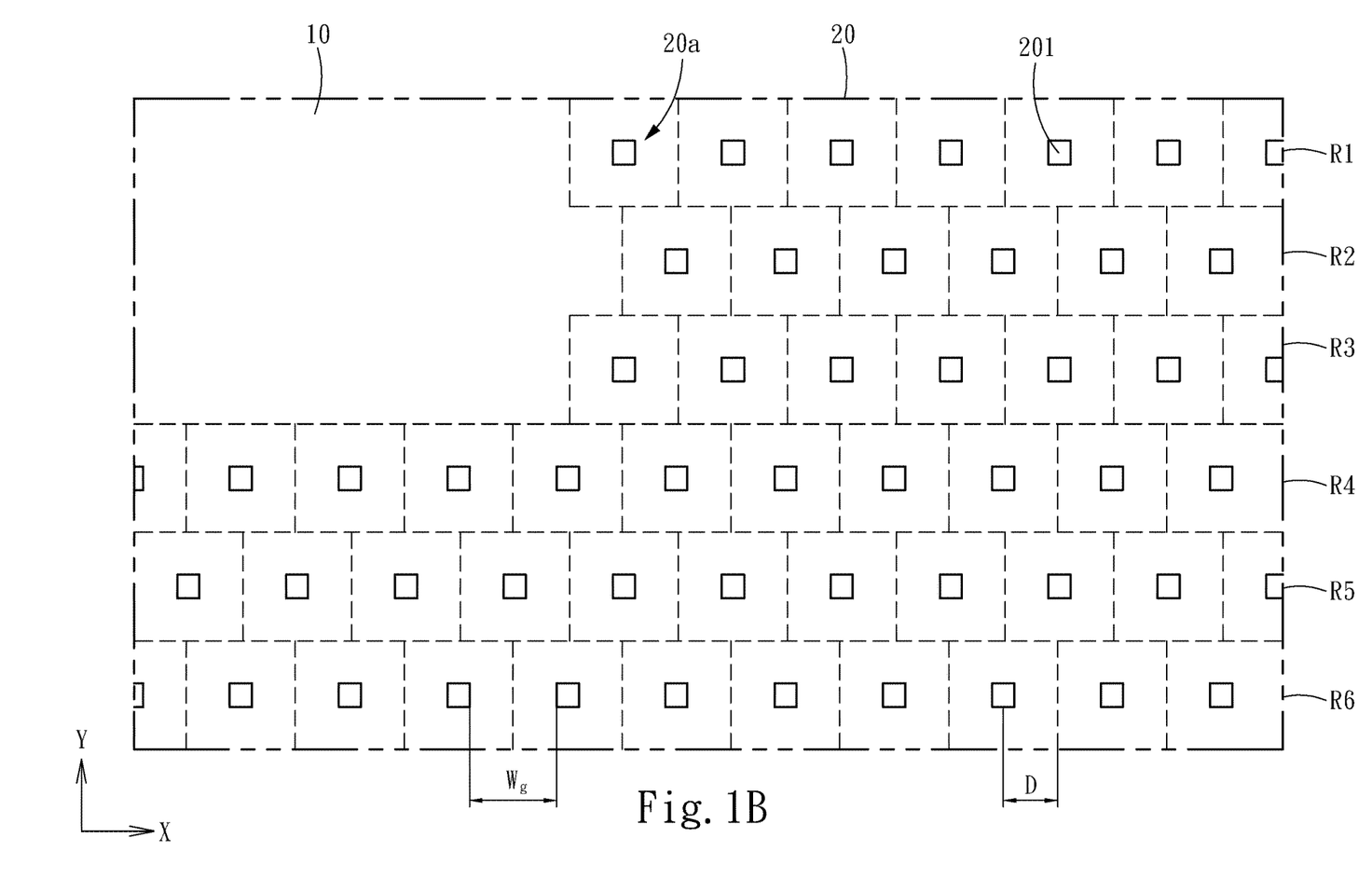
FIG. 1B is an enlarged view of a portion of FIG. 1A.

FIG. 1A to FIG. 1B show a top view of a gate electrode of a silicon carbide MOS-gated semiconductor device according to one embodiment of the present disclosure. The gate electrode comprises a gate bus region 10 and an active region 20. In the embodiment of FIG. 1A, the gate bus region 10 comprises only one gate pad area arranged within a central zone 21 of the active region 20. The gate pad area has four sides 10a, 10b, 10c, 10d adjacent to the active region 20. The active region 20 has a plurality of gate electrode openings 201 formed therein. As illustrated in FIG. 1B, the active region 20 can be divided to a plurality of repeating cells 20a arranged in an ordered and repeating manner. The plurality of repeating cells 20a are arranged repeatedly along a first horizontal direction X to form a plurality of rows (R1 to R6 are shown), and the neighboring rows are arranged along a second horizontal direction Y in a staggered alignment, in which the adjacent repeating cells 20a are alternately dislocated by a displacement D. In the embodiment, the displacement D is half pitch of the repeating cells 20a.

Figure 1C:
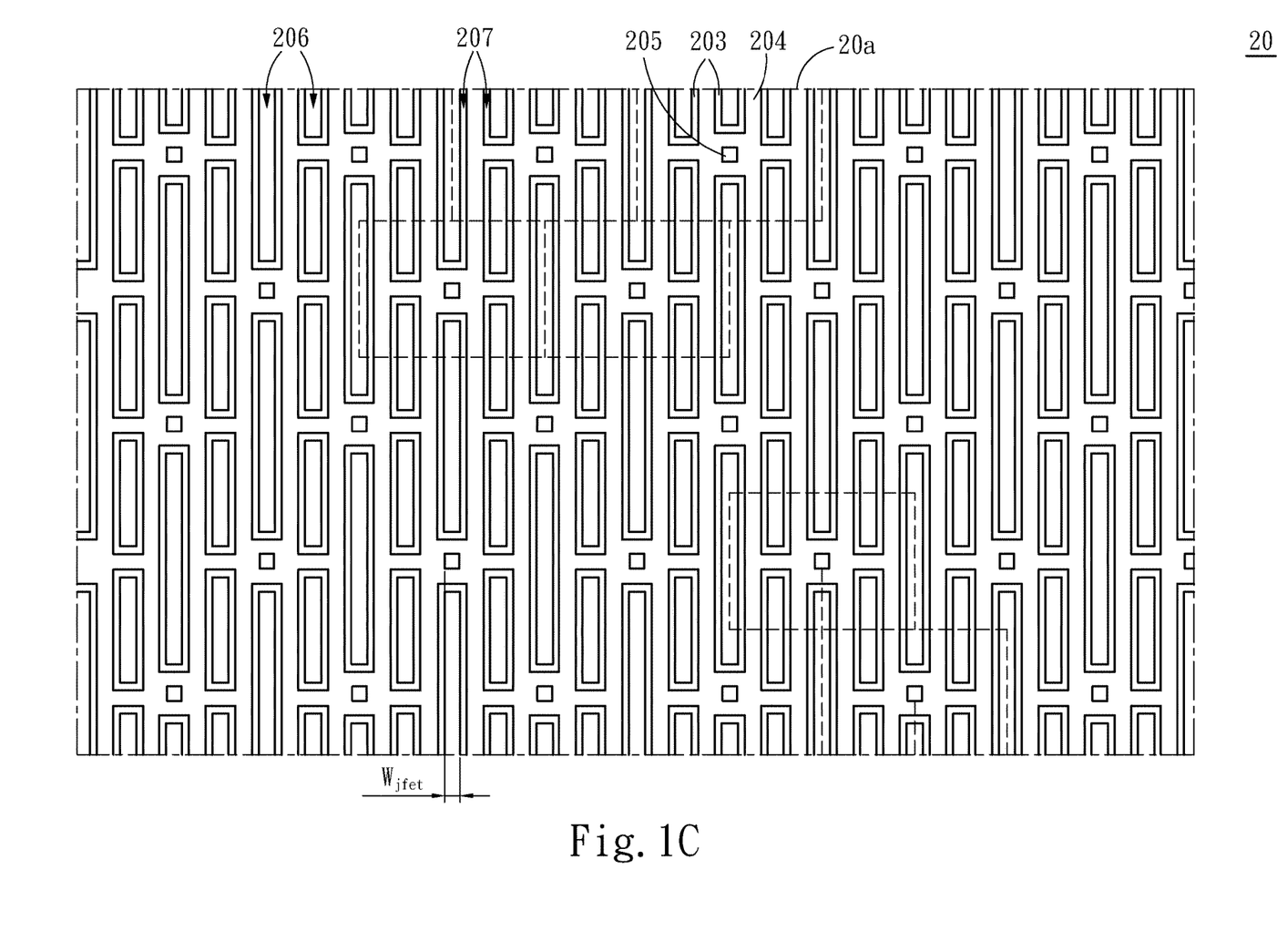
FIG. 1C is an enlarged view of a portion of FIG. 1C.

FIG. 1C depicts a top view of an enlarged portion corresponding to the active region 20 of FIG. 1B, but is viewed from a top surface of a drift layer. According to the embodiment, the drift layer corresponding to the active region 20 of the MOS-gated semiconductor device includes a first doped region 203, a second doped region 204 and a plurality of third doped regions 205 formed over the drift layer. The drift layer and the second doped region 204 has a first conductivity type. And both the first doped region 203 and the third doped regions 205 have a second conductivity type opposite to the first conductivity type.

Figure 2A:
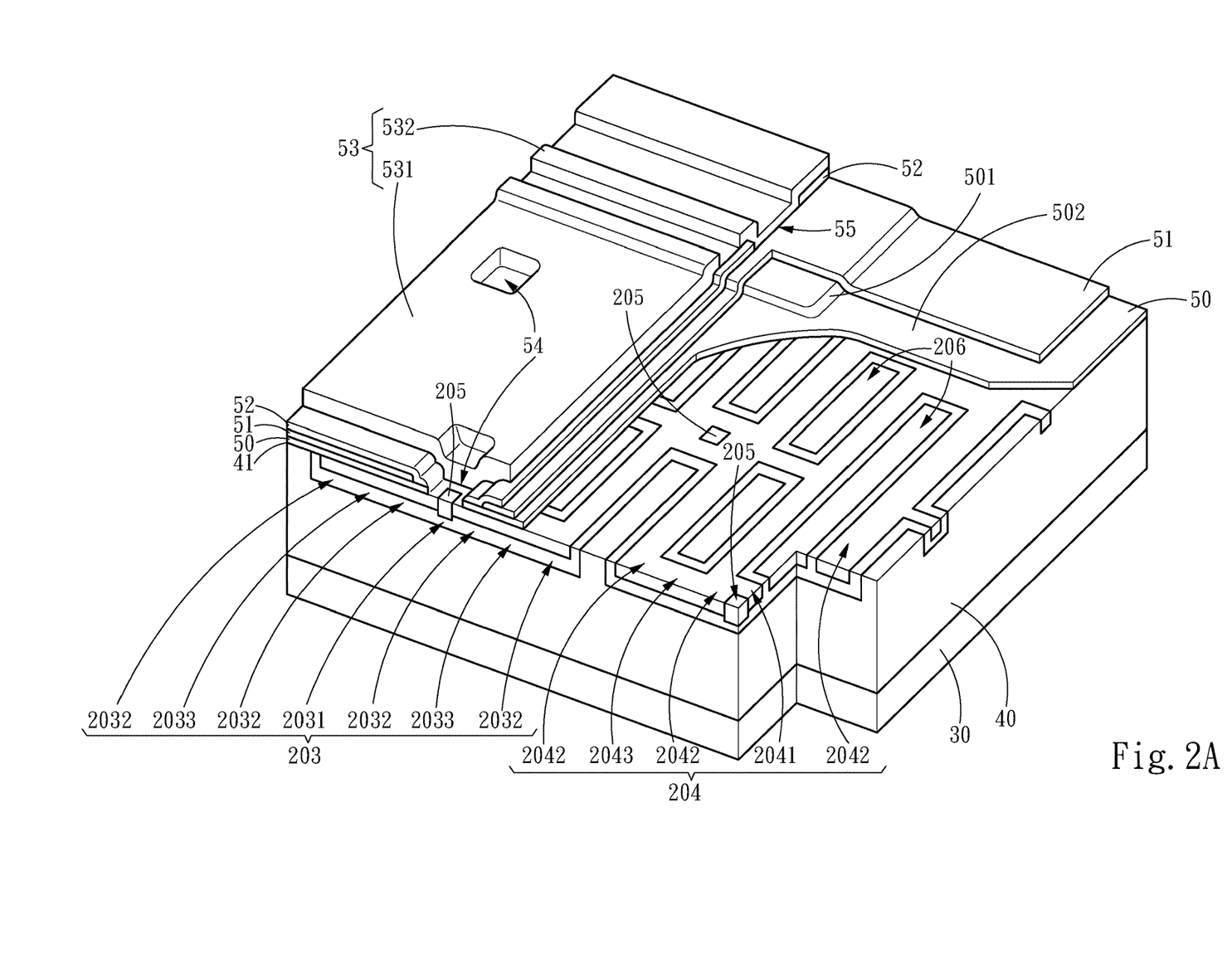
FIG. 2A illustrates a cross-sectional perspective view of a MOS-gated semiconductor device according to one embodiment of the present disclosure.

Referring to FIG. 1C and FIG. 2A. FIG. 2A illustrates a cross-sectional perspective view of a MOS-gated semiconductor device according to one embodiment of the present disclosure. This is a schematic representation, only partially illustrating structure of the MOS-gated semiconductor device. The MOS-gated semiconductor device includes a substrate 30, a drift layer 40, a first doped region 203, a second doped region 204, a plurality of third doped regions 205, a gate insulating layer 50, a gate electrode layer 51, an interlayer dielectric layer 52 and a metal layer 53. The substrate 30 is a silicon carbide substrate with heavily n-type (n+) doped. The drift layer 40 is lightly n-type (n−) doped and formed on the substrate 30. In the embodiment, the first conductivity type is n-type and the second conductivity type is p-type.

The first doped region 203 is formed in the drift layer 40 adjoining to a main surface 41 by, for example, ion-implantation of Aluminum ions into the nitrogen doped n-type SiC drift layer.

The second doped region 204 are formed in the first doped region 203 by, for example, ion-implantation of a high dose of Phosphorus ions into the drift layer 40 and forming a plurality of p-n junctions with p-type first doped region 203 and being enclosed by the first doped region 203 in an upper area adjoining to the main surface 41.

The third doped region 205 is formed by, for example, ion-implantation of a high dose of Aluminum ions into the drift layer 40, adjacent to a source portion 2041a of the second doped region 204 and in contact with the first doped region 203.

The gate insulating layer 50 is provided on the main surface 41 of the drift layer 40 by, for example, thermal oxidation of SiC or deposition of $SiO_2$ followed by annealing in the ambient containing nitrogen including but not limited to $N_2$ (nitrogen), NO (nitric oxide) and/or $N_2O$ (nitrous oxide). The gate electrode layer 51 is formed over the gate insulating layer 50. The gate insulating layer 50 has a first portion 501 of a first thickness below the gate bus region 10 of the gate electrode 51 and a second portion 502 of a second thickness below the active region of the gate electrode 51. The second thickness is less than the first thickness.

Figure 2B:
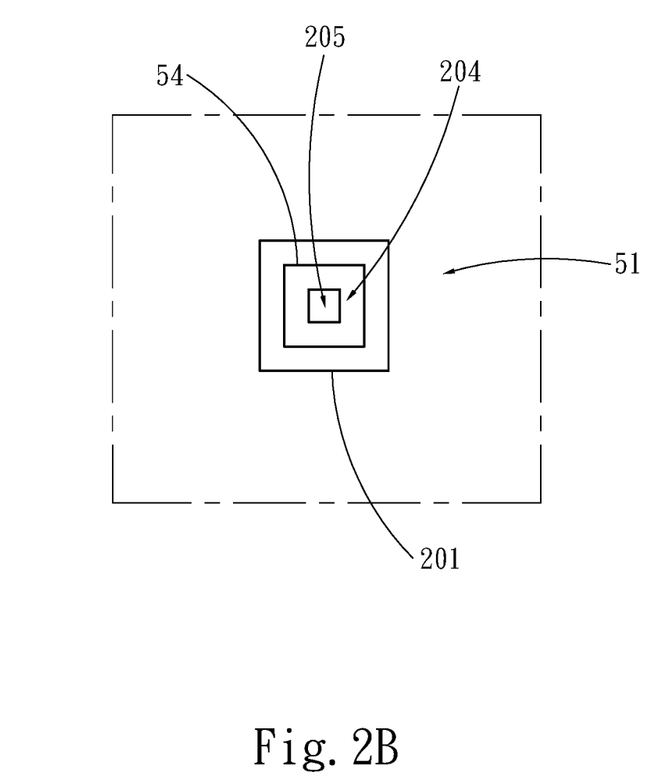
FIG. 2B is a schematic top view showing the gate electrode and the gate electrode opening.

Referring to FIG. 2B, FIG. 2B shows a single cell 20a of FIG. 1B, illustrating the gate electrode 51 and the gate electrode opening 201. The material of the gate electrode 51 is, for example, a degenerate n-type or p-type poly-silicon providing low sheet resistance, formed on the gate insulating layer 50 by deposition and then a portion of the gate electrode 51 is etched by dry etching to form the gate electrode opening 201. After the gate electrode openings 201 are formed, the interlayer dielectric layer 52 of a material comprising BSG (Borosilicate Glass), PSG (Phosphosilicate Glass), BPSG (Borophosphosilicate Glass), $SiO_2$, TEOS (Tetraethylorthosilicate), $Si_xN_y$, combinations thereof or the like is deposited to provide isolation between the gate electrode 50 and the metal layer 53. A plurality of source contacts 54 are then provided within the gate electrode openings 201. The source contacts 54 exposes the third doped region 205 and a portion of the second doped region 204 by etching through the interlayer dielectric layer 52 and the gate insulating layer 50. An Ohmic contact layer (not shown), for example a $Ni_xSi_y$ layer is formed within the source contacts 54 on the third doped region 205 and a portion of the second doped region 204 by removing a part of the drift layer 40.

Referring to FIG. 2A, at least one gate contact 55 is formed after the source contacts 54. The metal layer 53 is deposited on the interlayer dielectric layer 52 and filled into the source contacts 54 and the gate contact 55. The metal layer 53 is, for example, a metal layer comprises AlCu, AlSiCu, Al, Ti, TiN, TiW or the like formed by CVD or PVD. A first portion 531 of the metal layer 53 and the second portion 532 of the metal layer 53 are separated by dry etching, wet etching or the combination of dry etching and wet etching and later isolated from each other by filling the gap between the first portion 531 of the metal layer 53 and the second portion 532 of the metal layer 53 with a dielectric layer (not shown) comprising $SiO_2$, SiON, $Si_xN_y$ or the like. The first portion 531 of the metal layer 53 is defined above the active region 20 of the gate electrode 51 but isolated from the gate electrode 51 by the interlayer dielectric layer 52 and provides electric coupling with the third doped region 205 and the second doped region 204 through the source contacts 54. The second portion 532 of the metal layer 53 is defined above the gate bus region 10 of the gate electrode 51 and is electrically coupled to the gate electrode 51 through the gate contact 55.

In one embodiment, the gate bus region 10 of the gate electrode 51 comprises the gate pad area, and the second portion 532 of the metal layer 53 is disposed above the gate pad area and electrically coupled to the gate electrode 51 (not shown).

In another embodiment, the gate bus region 10 of the gate electrode 51 comprises the gate pad area and a plurality of gate runner areas, and the second portion 532 of the metal layer 53 is disposed above the gate pad area and the gate runner areas and electrically coupled to the gate electrode 51 to reduce the gate resistance (not shown).

Figure 2C:
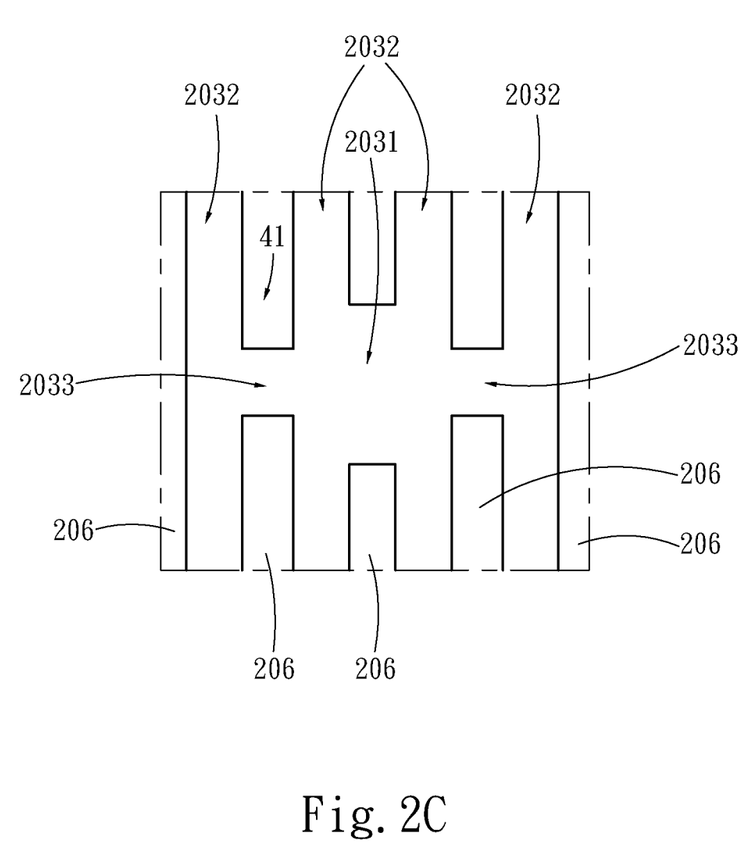
FIG. 2C is a schematic top view showing the first doped region in the drift layer.

Referring to FIG. 2A and FIG. 2C, FIG. 2C shows the first doped regions of a single cell 20*a*. The first doped region 203 comprises a plurality of body portions 2031, a plurality of first extending portions 2032 and a plurality of first connecting portions 2033. The body portions 2031, the first extending portions 2032, and the first connecting portions 2033 are connected with each other to form a network-like structure in the drift layer 40. The first extending portions 2032 are extended along the second horizontal direction Y. Moreover, the first extending portions 2032 are arranged side by side and spaced from each other. The body portions 2031 and the first connecting portions 2033 are extended along the first horizontal direction X and arranged alternatively between two of the first extending portions 2032. In one embodiment, some of the body portions 2031 and the first connecting portions 2033 are aligned along the first horizontal direction X so as to form a plurality of H-shaped structure connected with each other in two-dimensional. A plurality of JFET regions 206 are formed between any two of the extending portions 2032. After the second doped region 204 are formed within the first doped region 203, a plurality of channel regions 207 are formed between a first p-n junctions formed by the first doped region 203 and the second doped region 204 and a second p-n junctions formed by the first doped region 203 and the drift layer 40 adjoining the main surface 41, as shown in FIG. 1C and FIG. 2D.

Figure 2D:
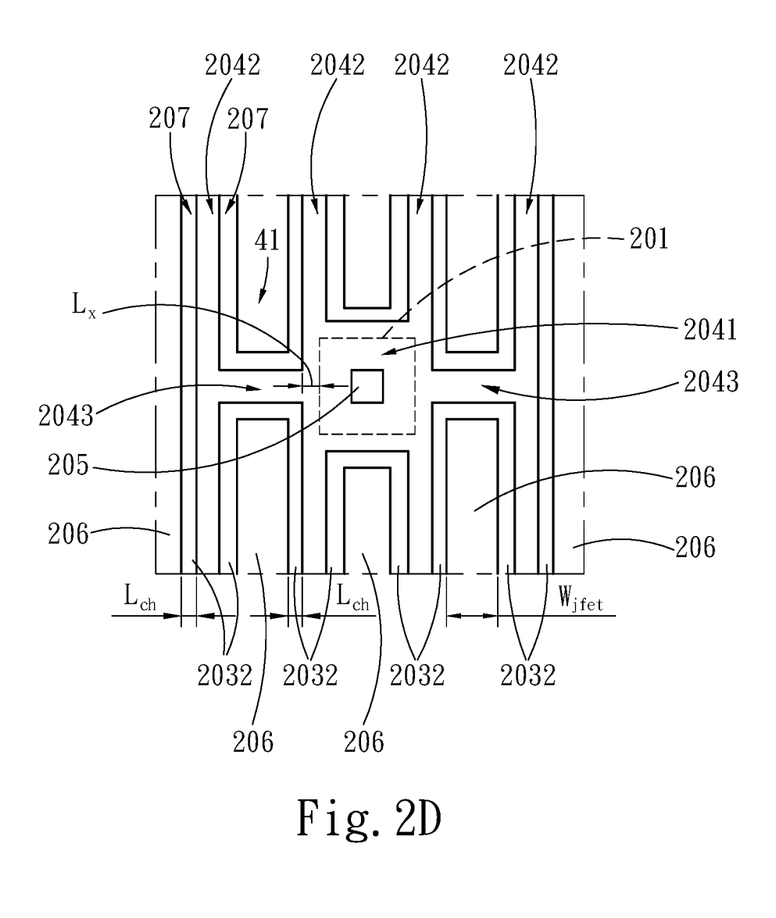
FIG. 2D is a schematic top view showing the second doped region and the third doped region in the first doped region.

Referring to FIG. 2A and FIG. 2D, the second doped region 204 includes a plurality of source portions 2041, a plurality of second extending portions 2042 and a plurality of second connecting portions 2043. The second extending portions 2042 and the second connecting portions 2043 are formed within the first extending portions 2032 and the first connecting portions 2033, respectively. The source portions 2041 are formed within the body portions 2031. The second doped region 204 is formed within the first doped region 203 in a way as shown in FIG. 2A such that the first doped region 203 are partially located below the second doped region 204 and partially extended to adjoin the main surface 41 of the drift layer 40.

When viewed from the top, each of the source portions 2041 is situated at the center portion of the single cell 20*a*. Similar to the layout of the first doped region 203, the source portions 2041 and the second connecting portions 2043 are extended along the first horizontal direction X and arranged alternatively between two of the second extending portions 2042. In one embodiment, some of the source portions 2041 and the second connecting portions 2043 are aligned along the first horizontal direction X so as to form a plurality of H-shaped structure connected with each other in two-dimensional.

Each of the third doped regions 205 is formed at a center portion of the cell 20*a* adjacent to the source portion 2041 of the second doped region 204 and in contact with the first doped region 203.

Referring back to FIGS. 1B, 1C, 2A and 2D, in the present disclosure, the two adjacent gate electrode openings 201 are spaced by a minimum width ($W_g$), which follows (or satisfies) the following formula:

$$W_g > W_{jfet} + 2 \times L_{ch} + 2 \times L_x$$

$L_{ch}$ represents a channel length of the channel regions 207, $W_{jfet}$ represents a minimum width of the JFET regions 206 and $L_x$ represents a minimum overlapping length between the gate electrode 51 and the second doped region 204. Because the minimum gate width $W_g$ of present disclosure is larger than that of the conventional structure (in which the minimum gate width equals to $W_{jfet} + 2 \times L_{ch} + 2 \times L_x$), a lower internal gate resistance could be achieved. For example, a SiC MOSFET of the present disclosure shows an internal gate resistance of 5 Ohm, while the SiC MOSFET with conventional structure has the internal gate resistance of 26 Ohm under similar chip size. There is another SiC MOSFET of the present disclosure, where the chip size is only about half of the SiC MOSFET with conventional structure and the internal gate resistance of this another SiC MOSFET is 10 Ohm, still obviously lower than that of the SiC MOSFET with conventional structure. As such, the MOS-gated semiconductor device according the present disclosure has advantage of reduced switching loss and faster switching rate.

According to an embodiment of the invention, the gate bus region 10 comprises only one gate pad area, and a gate resistance of the MOS-gated semiconductor device is adjustable depending on a position of the gate pad area relative to the active region 20.

Figure 3:
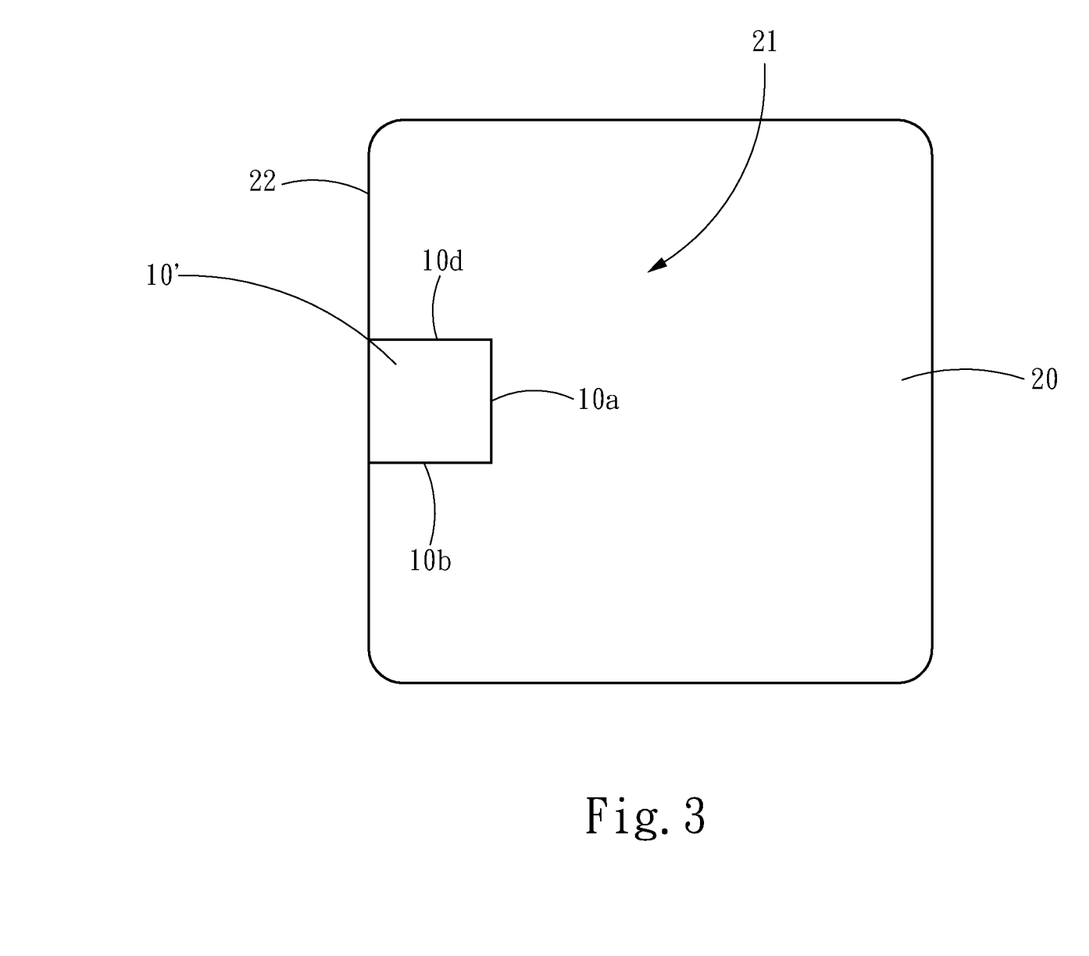
FIG. 3 to FIG. 9 show different embodiments of a MOS-gated semiconductor device according the present disclosure.
Figure 4:
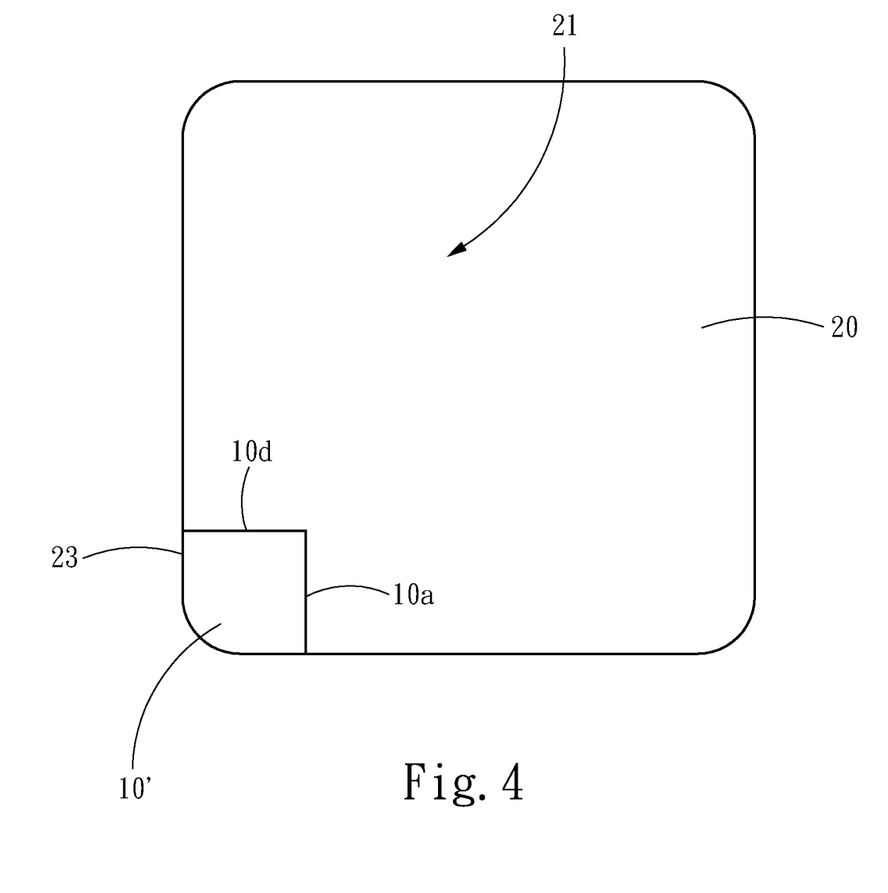

In the embodiment of FIG. 1A, the gate pad area is arranged as surrounded by the active region 20 and four sides 10*a*, 10*b*, 10*c*, 10*d* of the gate pad area are connected to the active region 20. FIG. 3 to FIG. 9 depict different embodiments of a MOS-gated semiconductor device according the present disclosure. In the embodiment of FIG. 3, the gate pad area 10' is arranged along an edge 22 and three sides 10*a*, 10*b*, 10*d* of the gate pad area 10' are connected to the active region 20. In the embodiment of FIG. 4, the gate pad area 10' is arranged along a corner 23 and two sides 10*a*, 10*d* of the gate pad area 10' are connected to the active region 20. The MOS-gated semiconductor devices in FIG. 1A, FIG. 3, and FIG. 4 have a first gate resistance, a second gate resistance, and a third gate resistance respectively. The first gate resistance is lower than the second gate resistance, and the second gate resistance is lower the third gate resistance. For example, a SiC MOSFET with the gate pad area 10' arranged as FIG. 1A shows the gate resistance of 5 Ohm, and a SiC MOSFET with the gate pad area 10' arranged as FIG. 4 shows the gate resistance of 15 Ohm, although the areas of the active region 20 in these two SiC MOSFETs are exact the same.

Figure 5:
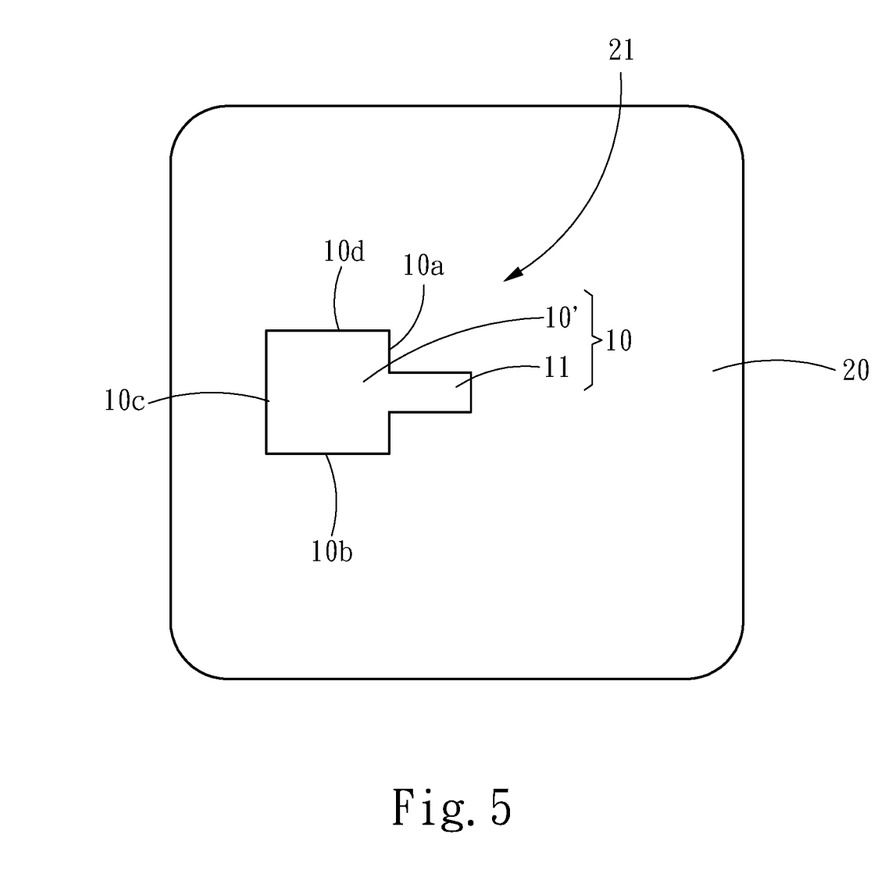
Figure 6:
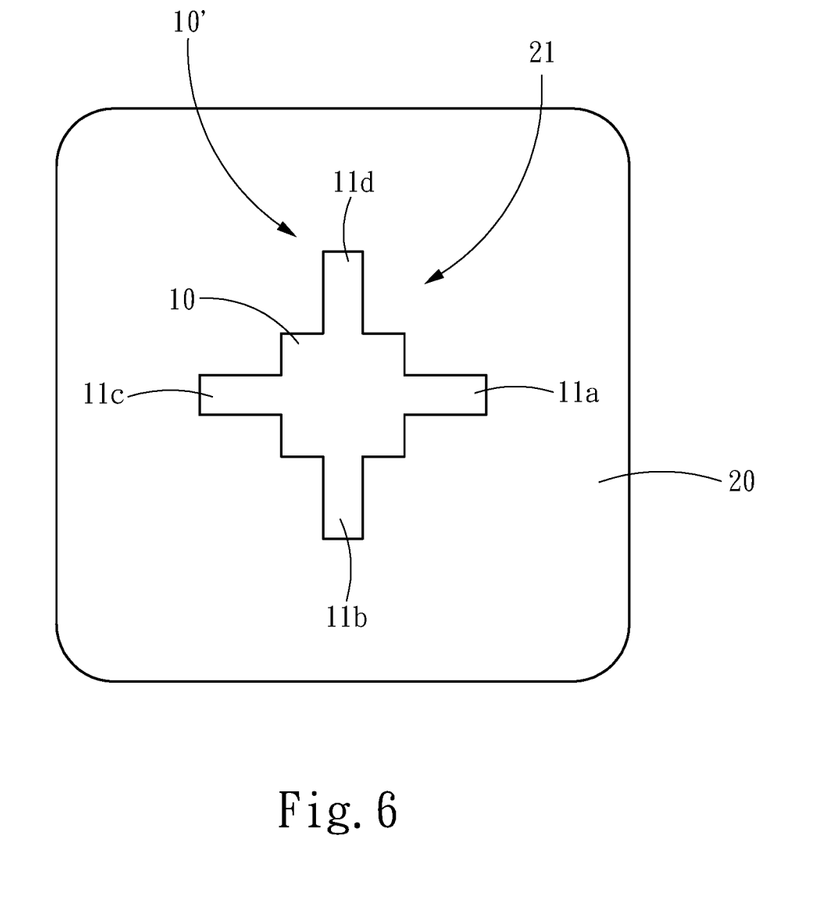
Figure 7:
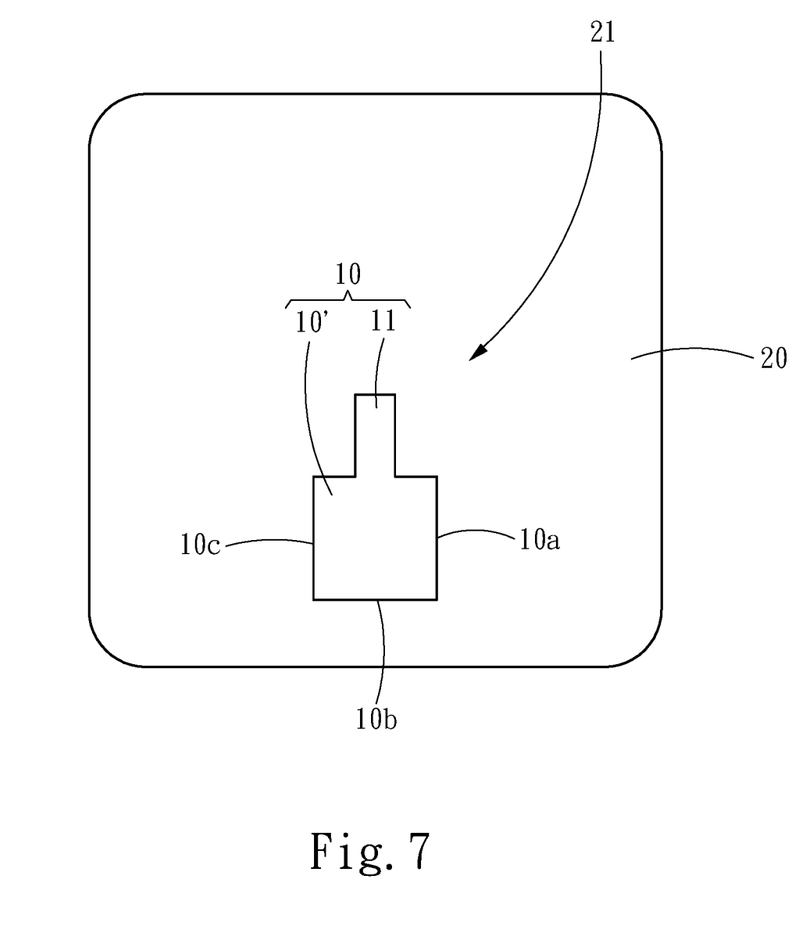
Figure 8:
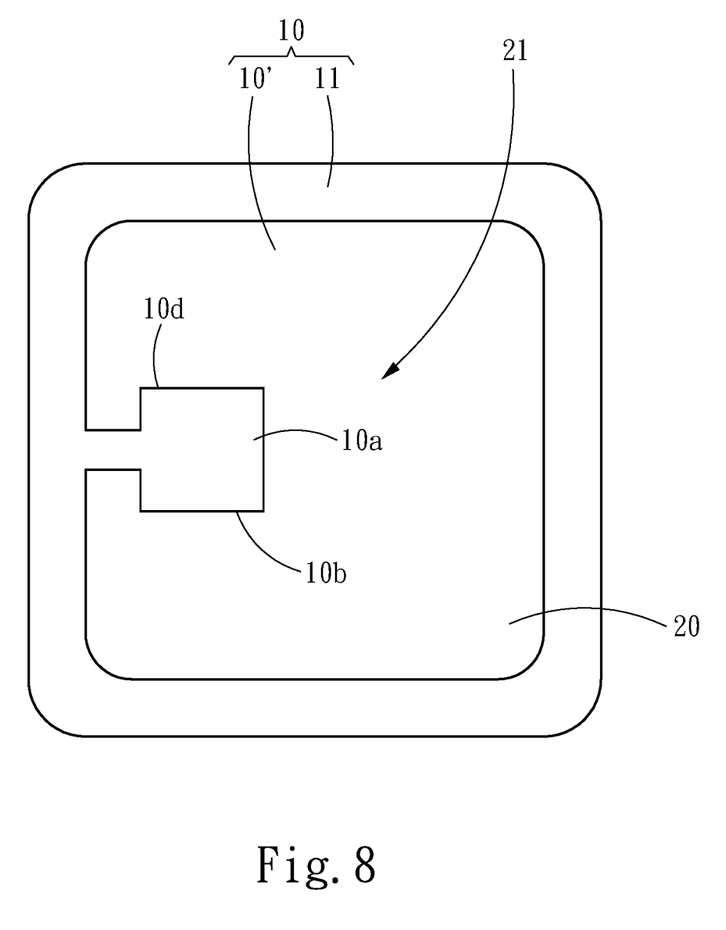
Figure 9:
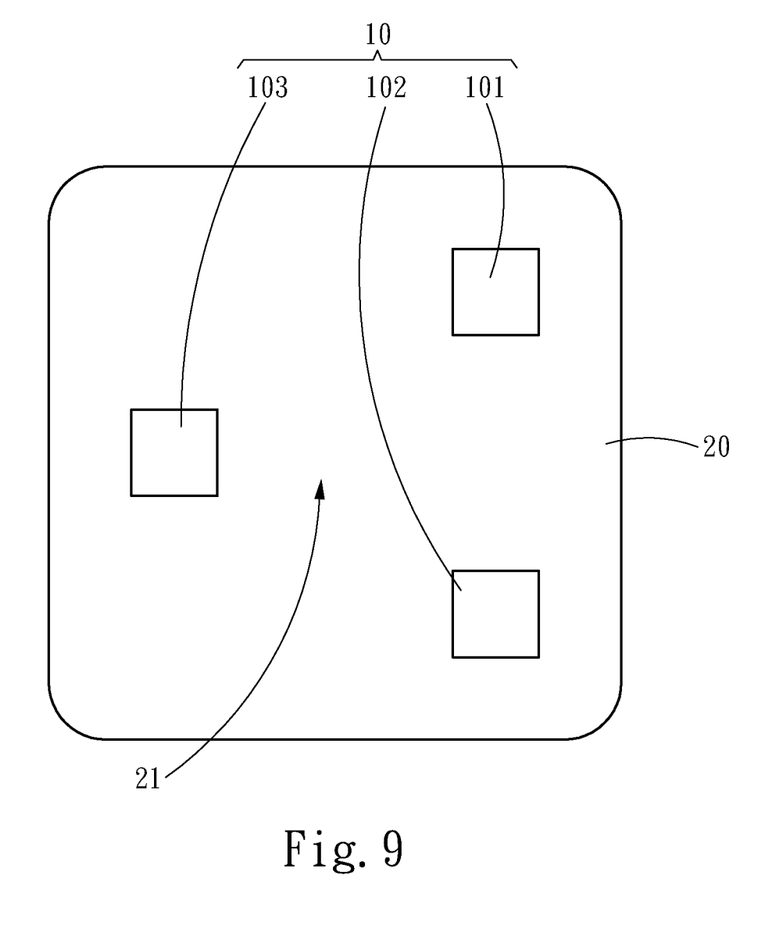

In another embodiment of FIG. 5, the gate bus region 10 is arranged at the central zone 21 of the active region 20, and the gate bus region 10 comprises a gate pad area 10' and a gate runner area 11 extending from the gate pad area 10' along the first horizontal direction X. The gate runner area 11 is provided to further reduce the gate resistance but this is at the expense of a larger chip area and cost. In yet another embodiment of FIG. 6, the gate bus region 10 is arranged at the central zone 21 of the active region 20 and the gate bus region 10 further comprises a gate pad area 10' and four gate runner areas 11*a*, 11*b*, 11*c*, 11*d* extending from the gate pad area 10'. In one embodiment of FIG. 7, the gate bus region 10 is arranged at the central zone 21 of the active region 20, and the gate bus region 10 comprises a gate pad area 10' and a gate runner area 11 extending from the gate pad area 10' along the second horizontal direction Y. In still another embodiment of FIG. 8, the gate bus region 10 is arranged at the central zone 21 of the active region 20, and the gate bus region 10 further comprises a gate pad area 10' and a gate runner area 11 surrounding the active region 20. The gate runner area 11 can be arranged at a peripheral area of the MOS-gate semiconductor device, which is corresponding to a terminal region of the MOS-gate semiconductor device and outside of the active region 20. As such, the active region 20 does not sacrifice its area to dispose the gate runner area 11 so as to minimize the impact of including the gate runner area 11 on the total chip size and cost. In the other embodiment of FIG. 9, the gate bus region 10 comprises more than one gate pad area 10', three distributed gate pad areas 101, 102, 103 at the central zone 21 of the active region 20 are provided.

Figure 10:
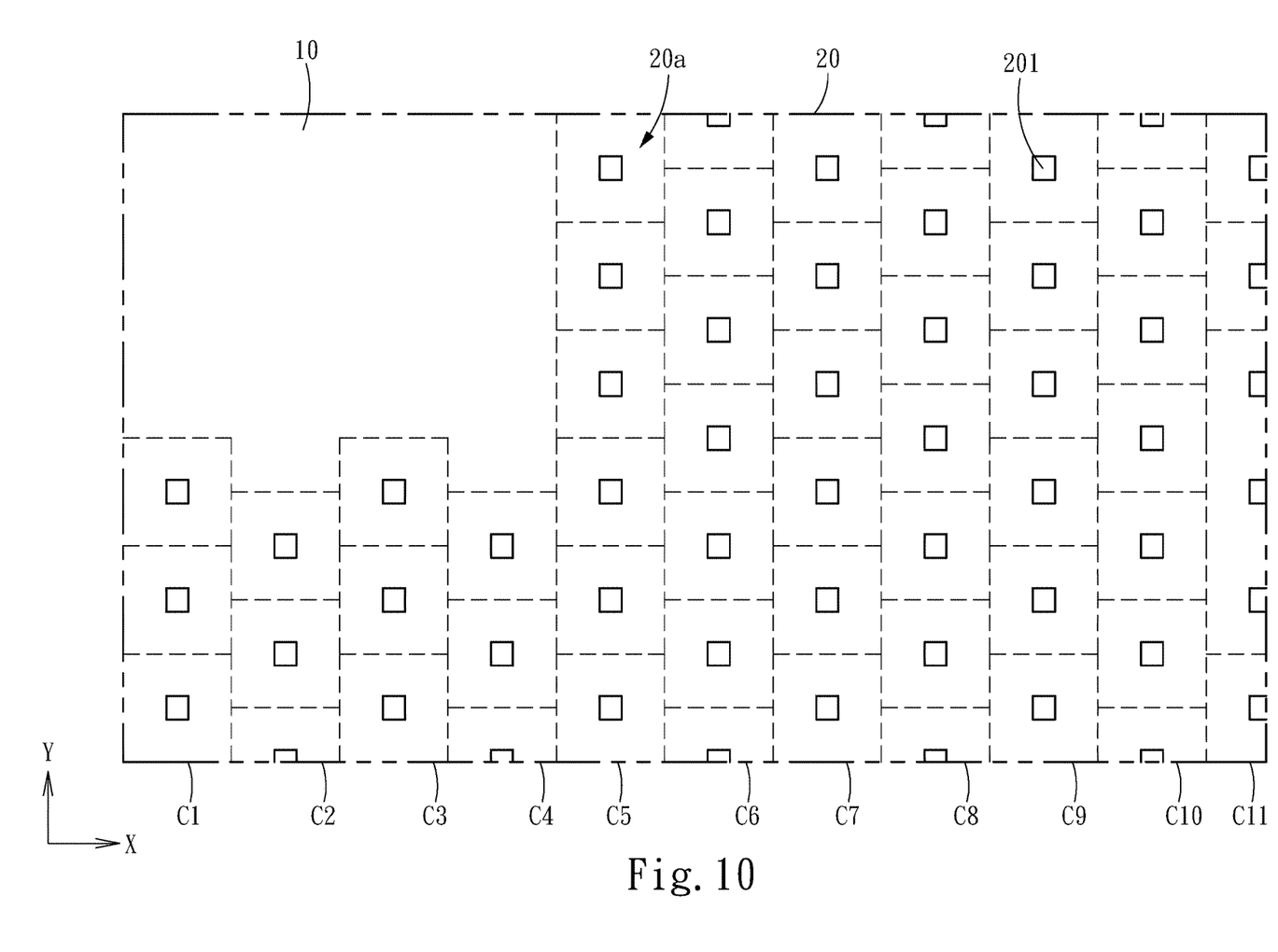
FIG. 10 is a top view of a MOS-gated semiconductor device according to one embodiment of the present disclosure.

FIG. 10 depicts a MOS-gated semiconductor device according to one embodiment of the present disclosure. Alternatively, the plurality of repeating cells 20a may be arranged repeatedly along the second horizontal direction Y to form a plurality of columns (C1 to C11 are shown), and the neighboring columns are arranged in a staggered alignment, in which the adjacent unit cells 20a are alternately dislocated by a displacement.

What is claimed is:

1. A silicon carbide MOS-gated semiconductor device, comprising:
   a silicon carbide substrate;
   a drift layer of a first conductivity type disposed on the substrate, the drift layer has a main surface;
   a first doped region of a second conductivity type opposite to the first conductivity type disposed in the drift layer, the first doped region forms a plurality of first p-n junctions and a plurality of JFET regions with the drift layer, wherein the first doped region comprises a plurality of first extending portions, a plurality of body portions and a plurality of first connecting portions, the first extending portions are extended along a second horizontal direction and arranged side by side and spaced apart, the body portions and the first connecting portions are extended along a first horizontal direction and arranged alternatively between two of the first extending;
   a second doped region of the first conductivity type disposed within the first doped region, the second doped region forms a plurality of second p-n junctions with the first doped region, a plurality of channel regions are defined between the first p-n junctions and the second p-n junctions along the main surface;
   a plurality of third doped regions of the second conductivity type disposed in the body portions of the first doped region and surrounded by the second doped region;
   a gate insulating layer formed on the main surface;
   a gate electrode being formed on the gate insulating layer and comprising a gate bus region and an active region, wherein the active region of the gate electrode comprises a plurality of gate electrode openings and a minimum width (WO of the gate electrode between two adjacent gate electrode openings is satisfied the following formula:

$W_g > W_{jfet} + 2 \times L_{ch} + 2 \times L_x$ wherein $L_{ch}$ represents a channel length of the channel regions, $W_{jfet}$ represents a minimum width of the JFET regions, and $L_x$ represents a minimum overlapping length between the gate electrode and the second doped region;
   an interlayer dielectric layer formed on the gate electrode; and
   a metal layer, formed on the interlayer dielectric, comprising a first portion of the metal layer and a second portion of the metal layer electrically being isolated from each other, the first portion of the metal layer disposed above the active region of the gate electrode and the second portion of the metal layer disposed above the gate bus region of the gate electrode, wherein the first portion of the metal layer being electrically coupled to the second doped region and the third doped regions through a plurality of source contacts formed through the plurality of gate electrode openings, and the second portion of the metal layer being electrically coupled to the gate electrode through a gate contact.

2. The silicon carbide MOS-gated semiconductor device of claim 1, wherein the active region is divided into a plurality of repeating cells on the main surface, wherein each of the repeating cells comprises at least one of the gate electrode openings.

3. The silicon carbide MOS-gated semiconductor device of claim 2, wherein the repeating cells being repeatedly arranged along the first horizontal direction to form a plurality of rows, and the neighboring rows are arranged in a staggered alignment, in which the adjacent repeating cells are alternately dislocated by a displacement.

4. The silicon carbide MOS-gated semiconductor device of claim 2, wherein the repeating cells being repeatedly arranged along the second horizontal direction to form a plurality of columns, and the neighboring columns are arranged in a staggered alignment, in which the adjacent repeating cells are alternately dislocated by a displacement.

5. The silicon carbide MOS-gated semiconductor device of claim 1, wherein the gate bus region of the gate electrode comprises a gate pad area and a gate resistance of the MOS-gated semiconductor device is adjustable depending on a position of the gate pad area relative to the active region of the gate electrode.

6. The silicon carbide MOS-gated semiconductor device of claim 5, wherein the second portion of the metal layer disposed above the gate pad area has a shape of corner-rounded rectangle or a shape of circle.

7. The silicon carbide MOS-gated semiconductor device of claim 1, wherein the gate bus region of the gate electrode comprises a plurality of gate pad areas and a gate resistance of the MOS-gated semiconductor device is adjustable depending on a number of gate pad areas and a position of the gate pad area relative to the active region of the gate electrode.

8. The silicon carbide MOS-gated semiconductor device of claim 7, wherein the second portion of the metal layer disposed above the gate pad area has a shape of corner-rounded rectangle or a shape of circle.

9. The silicon carbide MOS-gated semiconductor device of claim 1, wherein the gate bus region of the gate electrode comprises a gate pad area and a plurality of gate runner areas extending from the gate pad area.

10. The silicon carbide MOS-gated semiconductor device of claim 9, wherein the active region is fully enclosed by the gate pad area and the gate runner areas.

11. The silicon carbide MOS-gated semiconductor device of claim 1, wherein the silicon carbide MOS-gated semiconductor device is arranged as a metal oxide semiconductor field effect transistor (MOSFET) or a insulated gate bipolar transistor (IGBT).

* * * * *